(12) United States Patent
Nagata

(10) Patent No.: US 6,753,589 B2
(45) Date of Patent: Jun. 22, 2004

(54) SILICON SUBSTRATE

(76) Inventor: Seiichi Nagata, 6-2-1, 7-Chome, Hikaridai, Seika-Cho, Souraku-Gun, Kyoto 619-0237 (JP)

(*) Notice: Subject to any disclaimer, the term of this patent is extended or adjusted under 35 U.S.C. 154(b) by 0 days.

(21) Appl. No.: 09/859,863

(22) Filed: May 17, 2001

(65) Prior Publication Data

US 2001/0045613 A1 Nov. 29, 2001

Related U.S. Application Data

(62) Division of application No. 09/325,270, filed on Jun. 3, 1999.

(51) Int. Cl.[7] .......................... H01L 29/00; H01L 21/76
(52) U.S. Cl. ...................................... 257/510; 438/409
(58) Field of Search .......................... 257/510; 438/409, 438/960; 385/129

(56) References Cited

U.S. PATENT DOCUMENTS

| | | | |
|---|---|---|---|
| 4,016,017 A | * 4/1977 | Aboaf et al. | 148/DIG. 117 |
| 6,084,271 A | * 7/2000 | Yu et al. | 257/351 |
| 6,103,590 A | * 8/2000 | Swanson et al. | 438/409 |

* cited by examiner

Primary Examiner—Amir Zarabian
Assistant Examiner—Kiesha Rose
(74) Attorney, Agent, or Firm—Jordan and Hamburg LLP

(57) ABSTRACT

A silicon substrate has area-selectively formed porous silicon in which porosity, pore size, and pore size distribution of a porous silicon region and a shape of the porous silicon are controlled. In a silicon forming method of immersing the silicon substrate coated with a mask layer having an opening area into a solution to which forming current is applied, and anodically forming a part of the silicon substrate from the opening area of the mask layer so as to form a porous silicon area in the silicon substrate, the forming current is increased according to degree of growth of the porous silicon such that the interface current density between a growing end part of the porous silicon and silicon substrate in the anodizing process may be substantially kept at constant.

4 Claims, 17 Drawing Sheets

SILICON SUBSTRATE

This is a division, of application Ser. No. 09/325,270, filed Jun. 3, 1999.

This invention relates to a silicon (Si) substrate and a method of forming a silicon substrate. More specifically, the invention relates to a method for depositing a mask layer on a silicon substrate, so as to selectively form at least one kind of porous silicon regions in which porosity (P) and pore size (R) are controlled centering around a part from which said mask layer is partially removed, and to a method for forming a region in which an impurity is selectively doped in one of plural kinds of said porous silicon regions, and/or relates to a silicon substrate having a silicon dioxide region which is formed by oxidizing said porous silicon region.

BACKGROUND OF THE INVENTION

Porous Silicon (hereinafter referred to as PS) is a substance in which infinite numbers of pores in nanometers are formed in silicon. The porous silicon is formed by anodic oxidation (hereinafter referred to as forming) of silicon in an electrolyte solution containing hydrogen fluoride (HF) acid. As to the porous silicon of this kind, its fundamental forming method and physical properties have been studied as a material which can be expected to be applied to various products.

Especially, as shown in FIG. 19A, in a method of whole surface forming in which the whole of one surface 3 of a silicon substrate 1 is anodically formed, HF acid concentration and forming current are uniformly distributed from the whole surface of the substrate. Even if the forming proceeds to an arbitrary thickness (d) of a PS layer, an interface area between porous silicon 120 (FIG. 19A) and the silicon substrate 1 is constant at all times. Consequently, forming conditions do not drastically change with forming depth (d). That is, even if the forming is continued at constant forming current 121 (FIG. 19B), HF acid concentration and PS/Si interface current density (I.D.C.) 122 (FIG. 19B) can be easily kept at constant. Accordingly, this method makes it possible to obtain porosity 131 (FIG. 19C) and pore size 132 (FIG. 19C) independent of the forming depth (d), and there have been reported a number of studies about it as an optimum method for studying a relationship between a porous silicon forming method and physical properties of the porous silicon. Among these studies, [1] R. Herino, G. Bomchil, K.Barla, C. Bertrand, and J. L. Ginoux, J.Electrochem. Soc. 134,1994(1987) state details of a relationship between forming conditions and physical properties of the porous silicon to be formed in the whole surface forming.

As to a method of depositing a mask layer on a silicon substrate, and anodizing the silicon substrate centering around an opening area of said mask layer so as to selectively form the porous silicon region (hereinafter this method is referred to as selective forming), there are following major documents [2][5]: [2] P. Steiner and W. Lang, Thin Sold Films 255, 52 (1995), [3] K.Imai and H. Unno, IEEE Trans. Electron Devices ED31, 297 (1984), [4] V. P. Bondarenko, V. S. Varichenko, A. M. Dorofeev, N. M. Kazyuchits, V. A. Labunov, and V. F. Stel'makh, Tech. Phys. Lett. 19, 463 (1993), [5] V. P.Bondarenko, A. M. Dorofeev, and N. M. Kazuchits, Microelectronic Engineering 28, 447 (1995) and so on. The above documents [2] [5] introduce a method of the forming in a condition that the forming current is kept at constant.

The document [4] indicates that selectively formed PS is oxidized and employed for an optical waveguide. However, it does not give a detailed explanation of factors of change in a refractive index for confining light in the waveguide. Further, the document [5] indicates that an impurity can be doped into the selectively formed PS. However, it does not disclose a thought that an impurity is selectively doped into a specific PS region.

On the other hand, as to a known document for changing forming current with time in PS forming, [6] M. Berger et al. PCT/DE96/00913 discloses a method for it. Also, [7] A. Loni, L. T. Canham, M. G. Berger, R. Arens-Fischer, H. Munder, H. Luth, H. F. Arrand, and T. M. Benson, Thin Solid Film 279, 143 (1996) discloses a method for steeply changing continuous direct current in stages, thereby forming porous silicon in which porosity intermittently changes depending on current value.

The above prior arts [6] and [7] mainly disclose that the multilayer porous silicon having high porosity (60% or more) is formed and grown into an optical waveguide itself by employing the property that the refractive index of the porous silicon depends on the porosity, and disclose that the porous silicon is oxidized and the silicon dioxide which is not densified in a porous state, is grown into an optical waveguide. In the documents [6] and [7], forming current is changed with time and in stages, and kept at constant for a predetermined period.

As to documents mainly aiming at forming by pulse current, the following documents are given: [8] Xiao-yuan Hou, Hong-lei Fan, Lei Xu, Fu-long Zhang, Minquan Li, Ming-ren Yu, and Xun Wang, Tech. Phys. Lett., 68, 2323 (1996), and [9] L. V. Belyakov, D. N. Goryachev, and O. M. Sreseli, Tech. Phys. Lett. 22, 97 (1996). Both of the documents [8] and [9] compare an effect of the pulse current with that of continuous direct current in the whole surface forming of the silicon substrate. However, they disclose nothing about the selective forming.

Next, as to documents about oxidation of the porous silicon, there are following documents: [10] J. J. Yon, K. Balra, R. Herino, and G. Bomchil, J. Appl. Phys., 62, 1042 (1987), and [11] K. Balra, R. Herino, and G. Bomchil, J. Appl. Phys., 59, 439 (1986).

The above technical literatures [10] and [11] concern oxidation of porous silicon forming a whole surface, but do not concern selectively formed porous silicon. They emphasize the importance of porosity control because volume expansion and shrinkage caused by oxidation considerably depend on porosity. However, these documents state that the volume expansion caused by oxidation affects increase of thickness of a silicon dioxide film forming the whole surface even if the porosity is equal to or lower that the later-explained critical porosity.

All of the above-mentioned prior arts [1] [11] do not disclose a thought for designing porosity of the selectively formed porous silicon to be constant. The selective forming has following problems.

As shown in FIG. 17 for the later-described compared example, when the selective forming is carried out in the silicon substrate 1 (FIG. 17A) on which the mask layer 3 having an opening area 7 is deposited an interface area 111 (FIG. 17B) between the porous silicon 100 and silicon 1 changes (increases) as the forming proceeds. If the forming is carried out at constant forming current, interface current density 113 (FIG. 17C) in an interface 102 between porous silicon 100 and silicon 1 (FIG. 17D) relatively decreases as the forming proceeds. Accordingly, both of porosity 115 (FIG. 17D) and pore size of the porous silicon also decrease as the forming proceeds, wherein there is a problem that these values cannot be kept at constant. Further, in the selective forming, a limited condition that a supply route for HF in the forming solution, a supply route for forming current, and an escape route for anodic gas generated in the forming concentrate into the part 7 (FIG. 17A) from which said mask layer is removed cause problems.

In addition, various problems are caused by the volume change after oxidizing the porous silicon in the selective forming. Low porosity expands the volume after oxidation, and partially brings about inside stress on the PS/Si interface, which reduces the reliability of the applied devices. However, high porosity extremely shrink the volume after oxidation. If the porous silicon is applied to an optical waveguide and so on, the volume shrinkage makes it difficult to form the waveguide having a desirable shape. This invention makes it possible to minimize the volume expansion and shrinkage of the porous silicon after the oxidation by porosity control of the selectively-formed porous silicon, and besides, allows the selective doping of an impurity by pore size control.

SUMMARY OF THE INVENTION

This invention is made in the above-described background. First object of the present invention is to provide a silicon substrate having a porous silicon region in which porosity, pore size, pore size distribution and PS/Si interface shape are controlled into predetermined values in selective forming of the porous silicon region on one surface of the silicon substrate, and to provide methods for forming said silicon substrate. The first method is a method for directly forming porous silicon having any desired porosity, pore size and pore size distribution. The second method is a method for forming porous silicon having porosity, pore size and pore size distribution of specific values, and then partially oxidizing the formed porous silicon. The partial oxidation of the porous silicon expands the volume of the silicon according to degree of oxidation, so that a fraction of pore spaces decreases. That is, this increases the volume of solid parts consisting of silicon column and silicon dioxide in the porous silicon, and decreases pore size. On the other hand, if the oxide film is removed by dilute HF acid, the volume of solid parts is decreased, and pore size is increased. Employing combination of these effects, the method forms the porous silicon having any desired porosity, pore size and pore size distribution. Second object of the present invention is to provide a method of continuously forming plural kinds of porous silicon regions each of which has any desired porosity, pore size and pore size distribution. Third object of the present invention is to provide a method of selectively doping a desired impurity into a specified region of plural porous silicon regions, and provide a silicon substrate in which physical properties of the specified region are controlled. Fourth object of the present invention is to minimize the volume change of the porous silicon before and after oxidation, thereby providing a silicon substrate in which a surface of the formed silicon dioxide region is in the same plane as an original surface of the silicon substrate, and providing a forming method of said silicon substrate.

In order to achieve the above-mentioned objects, in a silicon substrate in which a silicon dioxide region is selectively formed in one surface, when depth of said silicon dioxide region is "b", and difference between the surface of said silicon dioxide region and one surface of said silicon substrate is "c+d", the value (c+d)/b is designed to be in a range of ±13%.

According to a silicon substrate in which a porous silicon region is selectively formed in one surface, porosity of said porous silicon region is designed to be from 52% to 65%.

Further, in a method of forming a silicon substrate wherein said silicon substrate which is clad by a mask layer having an opening area is immersed into a forming solution to which forming current is applied, and then a part of the silicon substrate is anodized from the opening area of the mask layer so as to selectively form a porous silicon region in the silicon substrate, the forming current is changed dependent on degree of growth of the porous silicon such that the interface current density between a growing end part of the porous silicon and silicon substrate in the anodic forming process may be substantially kept at constant.

Furthermore, in a method of forming a silicon substrate, the forming current is pulse current, and applying time per unit pulse and/or repeating time thereof are changed with growth of the porous silicon region.

Moreover, in a method of forming a silicon substrate, wherein said silicon substrate which is clad by a mask layer having an opening area is immersed into a forming solution to which forming current is applied, and then a part of the silicon substrate is anodically formed from the opening area of the mask layer so as to selectively form a porous silicon region in the silicon substrate, the porous silicon region is formed, following which, an oxide film is formed on the surface of said porous silicon region.

BRIEF DESCRIPTION OF THE DRAWINGS

FIG. 1A is a perspective cross sectional view, FIG. 1B is a view showing dependence of forming current 21 and interface current density 22 on forming depth "r", and FIG. 1C is a view showing that porosity 31 and pore size 32 are designed to be substantially constant independent on the forming depth;

FIG. 2A is a view showing a detailed pattern of applying pulse current 80, FIG. 2B is a view showing a summarized pattern of the pulse current in an initial stage 81, a middle stage 82, and a closing stage 83;

FIG. 4A shows a relationship between a reciprocal of absolute temperate and a fraction of silicon dioxide, FIG. 4B schematically shows silicon column 62 and pore size 63 in the porous silicon, and FIG. 4C schematically shows silicon columns 64 and oxide films 65 in partially oxidized porous silicon;

FIG. 6A is a cross-sectional view, FIG. 6B shows a controlling method of forming current, interface current density and HF acid concentration, and FIG. 6C schematically shows forming depth dependence of controlled porosity and pore size in plural layers;

FIG. 8A shows the relationship for a wide range of porosity, and FIG. 8B shows the relationship for a narrow range of porosity;

FIG. 9A is a cross-sectional view, FIG. 9B shows a whole shape of a cross section, and FIG. 9C shows the silicon dioxide surface in detail;

FIG. 11A shows the relationship for a wide range of concentration, and FIG. 11B shows the relationship for a narrow range of concentration;

FIG. 12A is a cross sectional view, and FIG. 12B is forming depth dependence of porosity and pore size;

FIG. 17A is a perspective cross sectional view, FIG. 17B is view showing forming depth dependence of interface area, FIG. 17C is a view showing forming depth dependence of interface current density, and FIG. 17D is a view schematically showing forming depth dependence of porosity;

FIG. 19A is a perspective cross sectional view, FIG. 19B is a view showing forming depth independence of forming current and interface current density, and FIG. 19C is a view showing forming depth independence of porosity and pore size.

DETAILED DESCRIPTION OF THE PREFERRED EMBODIMENT OF THE PRESENT INVENTION

Hereafter, the embodiments of the present invention will be explained with reference to the accompanying drawings.

Basic characteristics of porous silicon are determined by porosity (P), pore size (R), and pore size distribution (ΔR). It is noted that the porosity (P) is defined by volume percentages of pores through the whole volume of the porous silicon, the pore size (R) is defined as diameter of pores, and the pore size distribution (ΔR) is defined as the distribution of pore size.

Figure 3:
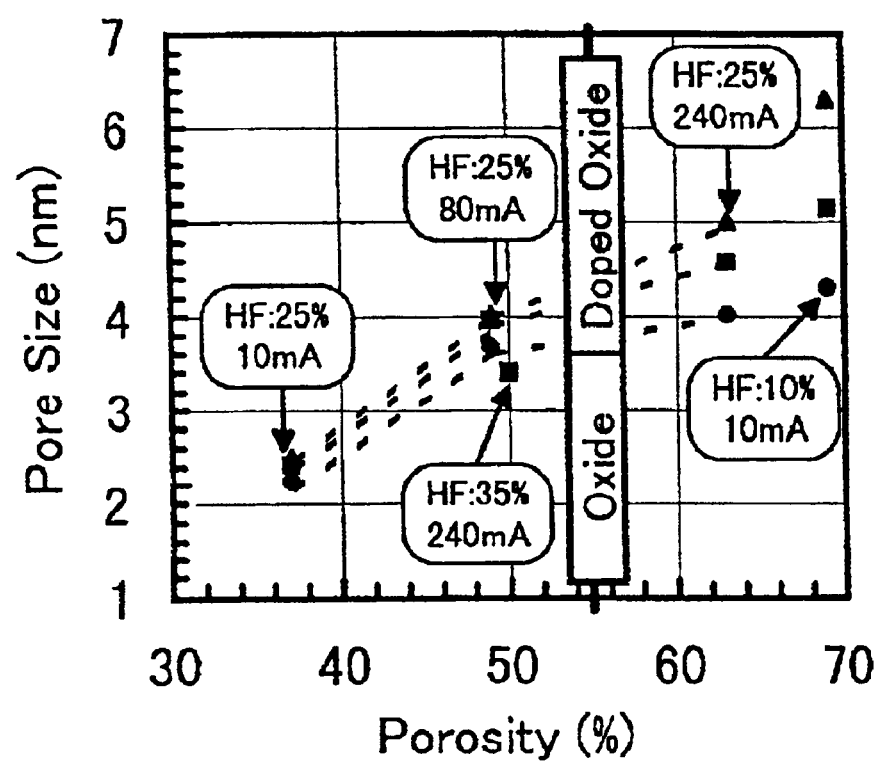
FIG. 3 is a view showing that porosity and pore size are controlled into arbitrary values by choosing HF acid concentration and forming current density, and showing desirable combination of porosity and pore size in the case of selectively doping an impurity into porous silicon and/or oxidizing the porous silicon.

As to the porous silicon, its porosity (P), pore size (R), and pore size distribution (ΔR) depend on doping characteristics of a silicon substrate to be used, HF hydrofluoric) acid concentration, and interface current density between the porous silicon and a silicon interface. In the case of a highly doped p-type silicon substrate, the porosity, pore size, and pore size distribution are changed as shown in FIG. 3. In FIG. 3, ■ show peak values in the pore size distribution, and ▼ and ● show values of full width at half maximum of the distribution. As to comments in rounded rectangles, upper lines show HF acid concentration, and lower lines show the interface current density between porous silicon and silicon The Applicant composed FIG. 3 in forming a whole surface condition about the relationship between forming conditions and physical properties of the porous silicon, based on each of data reported in the above-mentioned study [1]. The figure points out important four properties of the porous silicon. First, the porosity and the pore size increase as the interface current density increases. Second, the porosity and the pore size decrease as the HF acid concentration increases. Third, increasing the HF acid concentration induces a narrowing of the pore size distribution. Particularly, using HF acid in a highly concentration induces an extreme narrowing of the pore size distribution, and the porosity becomes uniform. Fourth, the figure indicates that porous silicon having any desired porosity, pore size, and pore size distribution can be achieved by choosing the forming conditions of the HF acid concentration and interface current density.

Further, FIG. 3 indicates that, when the formed porous silicon is oxidized, it is required that the porosity be designed to be critical porosity (about 55%) as a desirable condition.

The present invention provides a method for forming porous silicon which satisfies the above-mentioned condition in the selective forming.

Considering usual concentration of the HF acid used in the conventional method, the present invention employs the HF acid concentration of up to about 50% that is the highest concentration to supply for industrial purposes, and besides, when further highly concentrated HF acid is required, it may employ the highest concentration. The interface current density is up to dozens of amperes/cm$^2$.

Using the highly concentrated HF acid greatly enhances interface smoothness between the porous silicon and silicon compared to the case of lowly concentrated HF acid.

When the porous silicon of the silicon substrate in the present invention is oxidized, and then, employed for a single-mode optical waveguide, it is desired that the porous silicon have mask opening width "w" of 20 μm or less. Although there is no especially limited conditions about the smallest value of the mask opening width "w", a width with good reproducibility is industrially desired in usual microstructure processes. If the mask opening width "w" becomes larger than 20 μm, it becomes difficult to design the condition for single-mode transmission. However, there is no upper limit of the mask opening width "w" in multi-mode optical waveguides.

Similarly, in the case of using the porous silicon as a single-mode optical waveguide, it is desired that forming depth "r" of the porous silicon be 100 μm or less. Within this range, the porous silicon can satisfy a function as the optical waveguide. If the forming depth "r" exceeds the above range, a region to be processed becomes larger than required. However, in the case of applying the porous silicon to a multi-mode optical waveguide, forming depth is not limited.

The above-mentioned limitations of the mask opening width "w", and forming depth "r" are determined based on a necessary and sufficient condition as the optical waveguide when the porous silicon is used for the optical waveguide. When the porous silicon is applied to other fields, these values can be flexibly determined.

First Embodiment for Controlling Porostly and Pore Size

Figure 1A:
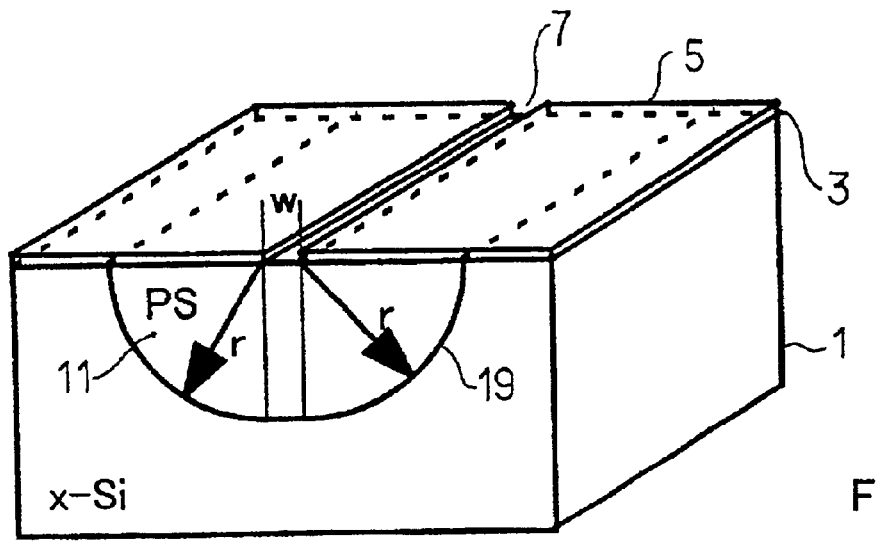
FIGS. 1A–1C are views showing a forming method of a silicon substrate.
Figure 1B:
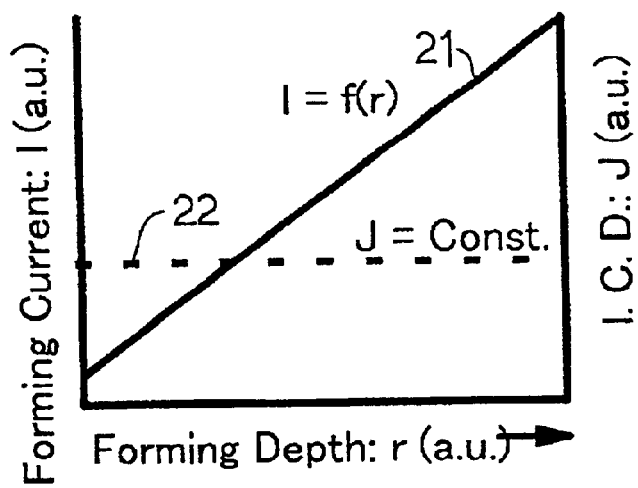
Figure 1C:
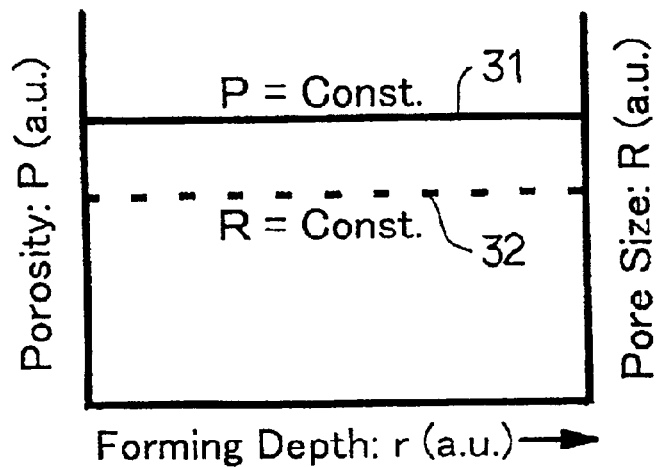

Hereafter, first embodiment of the present invention is explained referring to the drawings. FIG. 1A is a perspective cross sectional view, FIG. 1B is a view showing a method of controlling forming current so as to correspond to forming depth "r", and FIG. 1C is a view showing a dependence on forming depth "r" of the porosity and pore size of the formed porous silicon. In the present invention, it is desired that the silicon substrate 1 be a p-type silicon substrate having hole concentration of $1 \times 10^{18}$ cm$^3$ or more, that is, specific resistance of 0.1 Ωm or less. However, the substrate which supplies uniform charged electrons and holes to the interface between the porous silicon and silicon in the PS forming, basically satisfies the conditions of the present invention. In FIG. 1A, a mask layer 5 consisting of silicon nitride (SiNx) and so on, is deposited on one surface 3 of the silicon substrate 1, and on said mask layer 5, an opening area 7 which extends to a certain direction and has opening width "w" is formed by photo-etching and the like. Anodic forming of the silicon substrate in an electrolyte solution including HF acid uniformly forms a porous silicon region 11 having forming depth "r" (radius in porous region) starting from an end part of the opening area 7.

In the above-mentioned selective forming, at a certain point in the process of growing the porous silicon, an area of an interface 19 between the porous silicon 11 and silicon 1 per unit length is given by an equation below:

$$L = \pi r + w \quad (1)$$

When current per unit length which concentrates into the mask opening width "w" is denoted by I, interface current density J between the porous silicon 11 and silicon 1 is determined by an equation below:

$$J = I/L = I/(\pi r + w) \quad (2)$$

If the forming is carried out at constant current I, the interface current density J decreases in accordance with the above equation (2) (explained in a later-described compared example, refer to FIG. 17C). While the interface current density J is relatively high at an initial stage of the forming in which the forming depth "r" is small relative to the mask opening width "w", the interface current density J extremely decreases when "r" becomes large relative to the mask opening width "w" (i.e., r>w) as the porous silicon grows.

In order to fix the interface current density J at constant, it is needed to satisfy the equation:

$$I = J^* L = J^* (\pi r + w) \quad (3)$$

by increasing the forming current I in proportion to the interface area between the porous silicon 11 and silicon 1. That is, it is required to control the forming current as a function of forming depth "r" so as to maintain I=f(r). An example of controlling the forming current is schematically shown by solid line 21 in FIG. 1B. Dotted line 22 denoting a constant value controlled as shown in FIG. 1B indicates the interface current density controlled to constant value.

As indicated in the above equation (3), in order to keep the interface current density J (22) between the porous silicon 11 and silicon 1 at constant, it is desired that forming current I (21) be controlled so as to increase in proportion to the increase of the interface area. Thus, when the interface current density 22 is kept at constant, porosity 31 and pore size 32 of the porous silicon 11 takes on constant values independent on the forming depth "r" as shown in FIG. 1C.

Controlling forming current as described above carries a large amount of concentrated current into the mask opening area 7 with the increase of the forming depth "r" as shown in equation (3). Further, said forming current generates a large amount of anode gas from the interface between the porous silicon 11 and silicon 1. The escape route of said gas is limited to the opening area 7 having the width "w". Therefore, if forming current is controlled simply in a continuous direct current, there occurs a problem that the mask layer 5 is destroyed by pressure of a large amount of the generated gas. This produces cracks and delaminating of the mask. The cracks and delaminating of the mask layer 5 prevent the achievement of the object to selectively form a porous silicon region only in the desired part. Besides, the supply route for an electrolyte solution containing HF is also limited to the narrow opening area 7 with the width "w", which produces a problem of making it difficult to maintain the constant HF acid concentration in the forming solution consumed by the PS forming.

In order to avoid these problems, as shown in FIG. 1A, the forming is carried out by employing pulse current 80 having effective peak current value Ip, and effective peak duration time tp, and repeating period T. In this case, the effective peak current value is controlled so as to satisfy equations (2) and (3), or the condition of current value 21 in FIG. 1B. The pulse current carries out the forming, which can maintain high interface current density. On the other hand, the gas generated by the application of the pulse current can be escaped from the mask opening area 7 having the width "w" even during pulse stopping. Further, the electrolyte solution is supplied to the forming interface with the escape of the gas. Thus, the pulse current value Ip, duration time tp per unit pulse, and repeating period T are controlled such that average current value per unit time Ip*tp/T can be controlled to within a range for preventing the cracks and delaminating of the mask layer 5. The current value during pulse stopping (T tp) is not necessarily required to be zero, but cathode current may be carried.

Figure 2A:
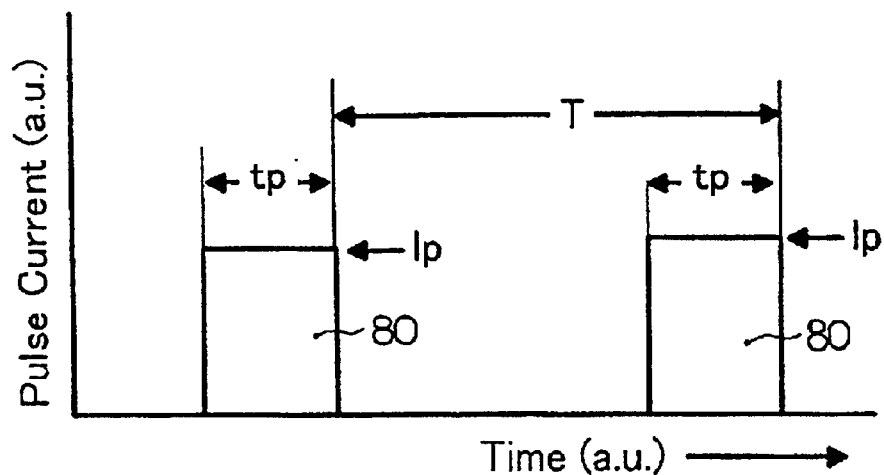
FIGS. 2A–2B are views showing a forming method of a silicon substrate.
Figure 2B:
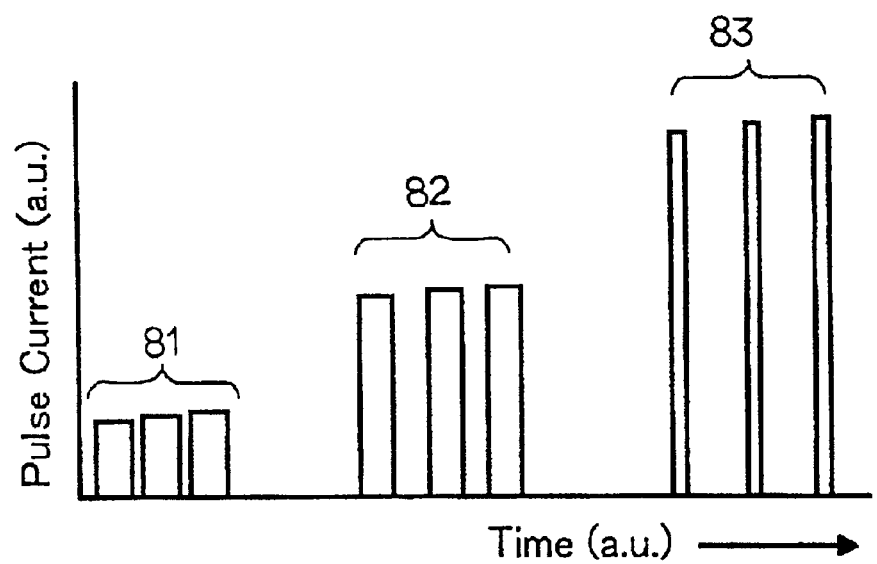

FIG. 2B schematically shows a conceptional relationship between pulse current value, time span for applying the current, time span for stopping the current in an initial stage 81, a middle stage 82, and a closing stage 83 of the forming. It is also possible to carry out a complex control which applies continuous direct current for small current density, and applies pulse current for large current density.

The above-described method allows the forming in the condition of the highly concentrated HF acid and high interface current density. Thereby, combining of lowly concentrated HF acid and low interface current density, this enables to directly form the porous silicon having controlled porosity and pore size in a wide area.

Second Embodiment

Second embodiment for designing any desired porosity and pore size is explained hereafter. In this embodiment, an initial process forms a porous silicon having a specified porosity and pore size, and then a following process transforms the porous silicon into a porous silicon having any desired porosity and pore size.

Figure 4A:
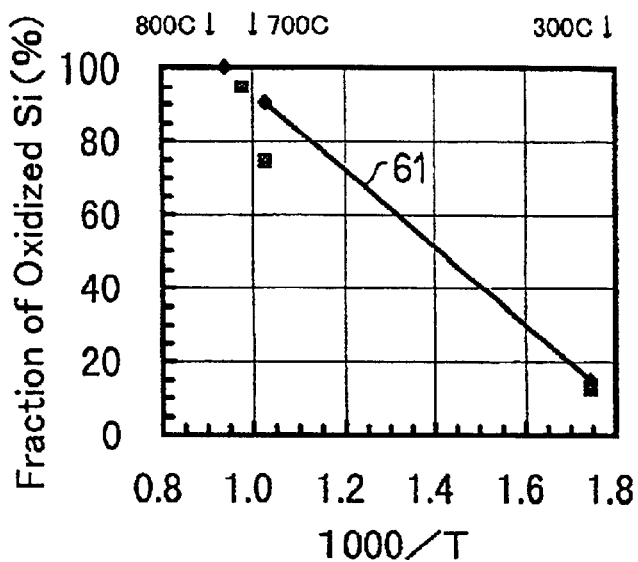
FIGS. 4A–4C is a view showing partial oxidation of the porous silicon.

FIG. 4A shows a relationship between fraction of the oxidized porous silicon and oxidation temperature in a treatment that the porous silicon is oxidized in dry oxygen atmosphere for long enough time (1 hour or more). The treatment at 300° C. (1000/T=1.74) grows silicon dioxide of nearly monomolecular layer on a surface of densified silicon column 62 inside the porous silicon. In this treatment, fraction of the oxidized porous silicon is about 15%. The treatment at 350° C. (1000/T=1.6) oxidizes about 30% of silicon, and grows silicon dioxide of nearly bimolecular layer. Further, the treatment at 800 oxidizes almost all amount of the silicon. In the treatment at the middle temperature therebetween, fraction of silicon dioxide depends or a reciprocal of absolute temperature as shown in FIG. 4A. Growth of monomolecular layer silicon dioxide reduces pore size by 0.5 nm (nanometers) because of volume expansion associated with oxidation. That is, pore size of silicon dioxide can be reduced in response to the degree of oxidation.

Figure 4B:
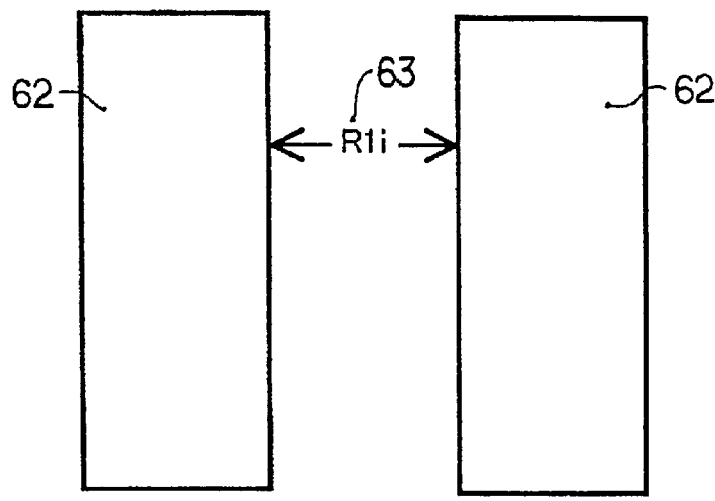
Figure 4C:
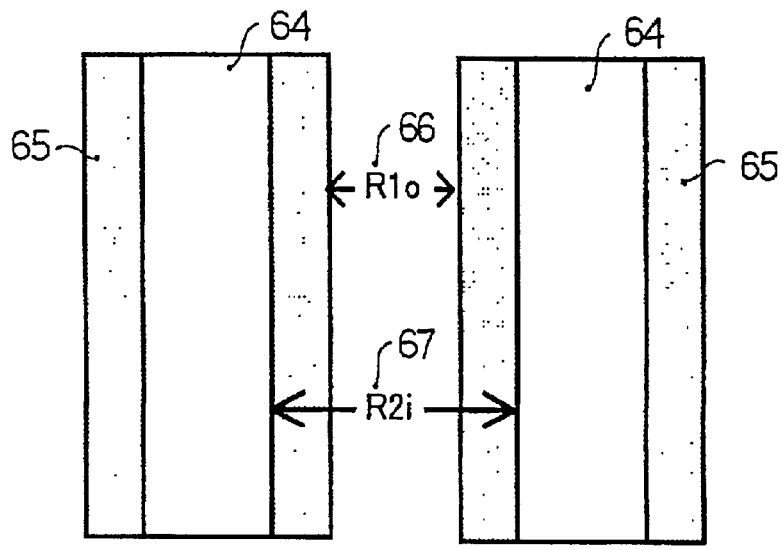

FIG. 4B is a schematic view showing a microstructure of porous silicon region. The porous silicon has infinite numbers of silicon column 62 cross-sectional size of which is in nanometers, and pores 63 size of which is almost same as the silicon column 62, which are alternately arranged. Size of the pores is denoted by R1$i$ 63. When the porous silicon is partially oxidized in dry oxygen atmosphere, the surface of silicon column 62 is oxidized for growing an oxide film 65 as shown in FIG. 4C. In the silicon column 62, fraction of the oxide film 65 and silicon remainder 64 depends on oxidation temperature as shown in FIG. 4A. The oxidation expands the silicon volume by two times compared to the volume before the oxidation. Consequently, sum volume of remainder silicon column 64 and oxide film 65 also expands, which resultantly reduces pore size R1$o$ 66 of the partially oxidized porous silicon. Thus, the partial oxidation of the porous silicon enables to control the pore size to be smaller than an original size.

On the other hand, the silicon dioxide part is removed from the partially oxidized porous silicon by etching in a dilute HF solution. Therefore, remainder silicon 64 becomes a lower than silicon column 62. As a result, effective pore size R2$i$ 67 becomes larger than original pore size R1$i$ 63, and porosity also increases. The increase rate of pore size and porosity can be controlled by the fraction of the partial oxidation.

Figure 5:
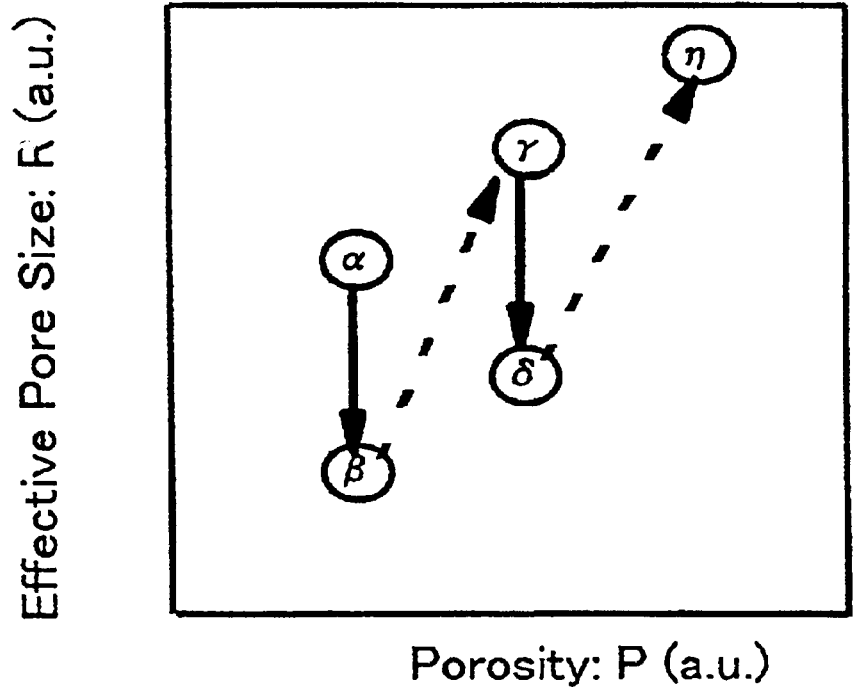
FIG. 5 is a schematic view showing a method of forming porous silicon region having arbitrary porosity and pore size by combination of processes for partial oxidation and removal of oxide film.

FIG. 5 schematically shows a process of combining partial oxidation and removal of the oxide film. The process starts with forming porous silicon designated as α. Then, the porous silicon is partially oxidized for transforming to state β. After that, the oxide film is removed for transforming to state γ. Similarly, this process is appropriately repeated from state δ to state η. Thereby, the porous silicon having any desired porosity and pore size can be formed.

In the above process, the porous silicon having specified small porosity and pore size is formed, and then, the porous silicon is transformed into the porous silicon having any desired porosity and pore size by the combination of said partial oxidation process and removal process of the oxide film.

Multilayer Forming

Figure 6A:
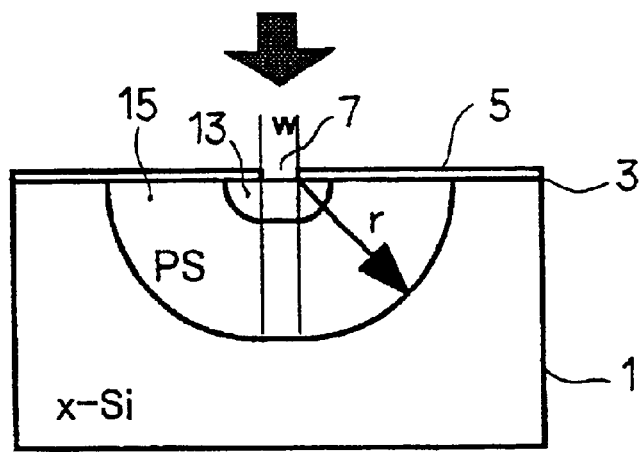
FIGS. 6A–6C are views showing a method of forming a multilayer porous silicon region in which porosity and pore size have controlled values.
Figure 6B:
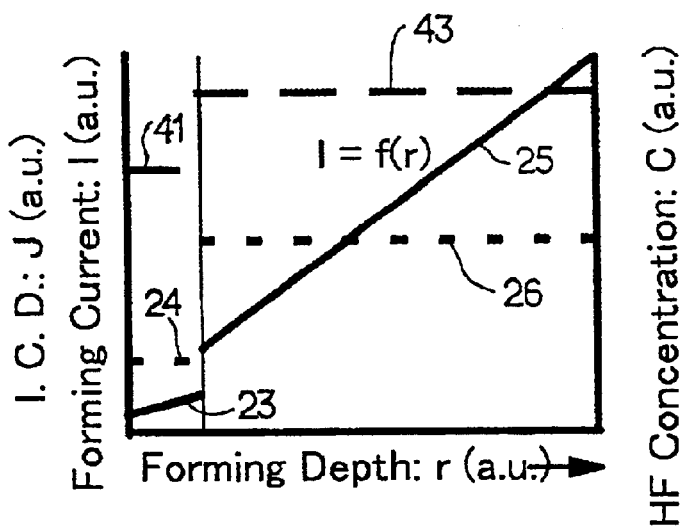

FIG. 6 shows an embodiment for forming the porous silicon having plural layers each of which has different characteristic. As shown in FIG. 6A, a first porous silicon region 13 having specified porosity and pore size, and a second porous silicon region 15 enclosing said first porous silicon region 13 are formed. FIG. 6B shows a relationship between HF acid concentration 41 and 43 (dashed lines), current values 23 and 25 (solid lines) and interface current density 24 and 26 (dotted lines) in the forming of the porous silicon regions. The first porous silicon region 13 is formed by the first HF acid concentration 41, and first interface current density 24. After that, the second porous silicon region 15 is formed by the second HF acid concentration 43 and second interface current density 26. In this case, the second HF acid concentration 43 is designed to be higher than the first HF acid concentration 41, and the second current density 26 is designed to be higher than the first current density 24 in correspondence with a difference between the first and second HF acid concentrations. Choosing these forming parameters substantially equalizes porosity 33 and 35 (solid lines) of the first and second porous silicon (P1=P2), and designs pore size 34 (dotted line) of the first porous silicon region 13 to be larger than pore size 36 of the second porous silicon region 15.

Choosing the forming conditions as mentioned above allows each of porous silicon regions to have any desired porosity and pore size.

Figure 7:
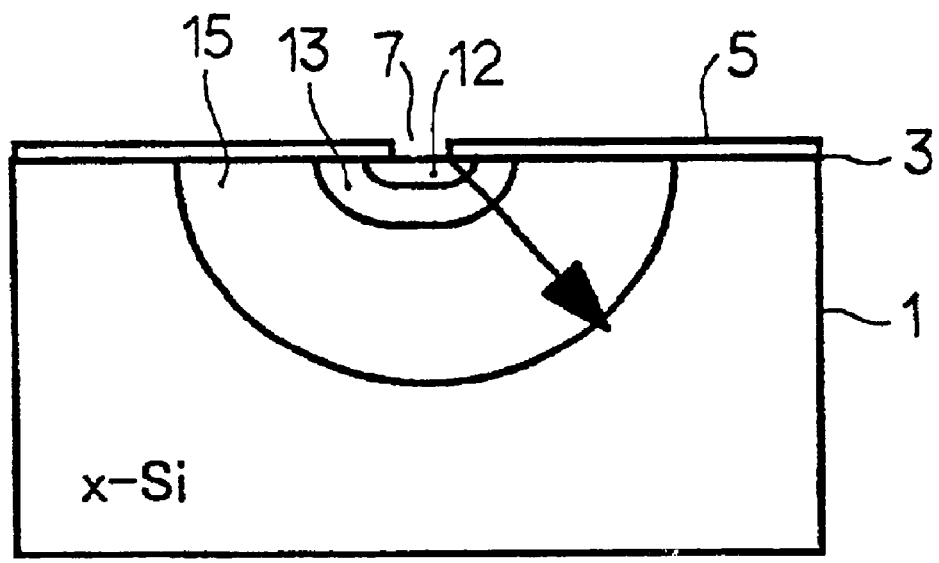
FIG. 7 is a view showing an example of forming a partial region inside a core region in an optical waveguide.

As an application of the above method, it is certainly possible to form another partial region 12 inside the first porous silicon region 13 as shown in FIG. 7.

Impurity Doping

Figure 6C:
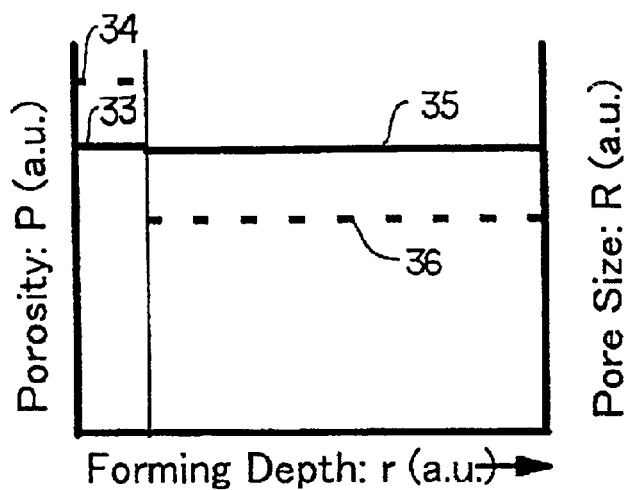

As shown in FIG. 6C, the pore size 34 of the first porous silicon region 13 which is formed by the method explained in FIG. 6, is designed to be larger than the pore size 36 of the second porous silicon region 15. Immersing the silicon substrate 1 on which plural porous silicon regions are formed, into an organic metal compound solution including metal elements, achieves selective doping of a metal organic compound into the porous silicon region 13 having pores of larger size.

Said metal organic compound may contain metal elements such as: aluminum (Al), boron (B), barium (Ba), bismuth (Bi), calcium (Ca), cadmium (Cd), cerium (Ce), cesium (Cs), dysprosium (Dy), erbium (Er), europium (Eu), gadolinium (Gd), germanium (Ge), hafnium (Hf), holmium (Ho), indium (In), lanthanum (La), lutetium (Lu), magnesium (Mg), niobium (Nb), neodymium (Nd), phosphorus (P), promethium (Pm), praseodymium (Pr), rubidium (Rb), antimony (Sb), samarium (Sm), tin (Sn), strontium (Sr), tantalum (Ta), terbium (Tb), titanium (Ti), thallium (Tl), thulium (Tm), yttrium (Y), ytterbium (Yb), tungsten (W), zinc (Zn), zirconium (Zr).

Among the above-mentioned metal elements, for example, boron (B) has a property for decreasing a refractive index in the silicon dioxide. Further, zirconium (Zr) and titanium (Ti) increase a refractive index. Furthermore, are earth elements such as erbium (Er) which are optically active impurities in silicon dioxide, have a property of light amplification and the like.

In the case of applying the porous silicon to the optical waveguide as described later, as to the elements for decreasing the refractive index, it is possible to dope them into both of the first porous silicon region 13 and second porous silicon region 15 shown in FIG. 6. On the other hand, as to the elements for increasing the refractive index, it is desired to selectively dope them only into the first porous silicon region 13. As to optically active rare earth elements, they can be doped into the first porous silicon region 13, besides, if it is necessary, as shown in FIG. 7, it is also possible to selectively dope them only into the partial region 12 in the region 13. As to selective doping of plural elements having different properties into different regions, metal organic compound molecules consisting of elements having a property for decreasing the refractive index are decreased in size; metal organic compound molecules consisting of elements having a property for increasing the refractive index are increased in size; and metal organic compound molecules consisting of elements such as optically active rare earth are further increased in size. Thereby, the selective doping is achieved in response to the pore size of each of porous silicon regions. In this process, changing sizes of metal organic compound molecules to be doped is allowed by prior arts as an object for designing metal organic compound molecules. Consequently, choosing combination between pore size and molecular size makes it possible to selectively dope the elements having various properties.

Problems Associated with Oxidation and Solution Thereof

The explanation is nextly given to how to control characteristics of the porous silicon in the case of oxidizing the above-formed porous silicon for growing the silicon dioxide in wet oxygen ambient, water vapor and so on.

Oxidation expands silicon volume. Porosity should be controlled such that pores of the porous silicon may be compensatively filled by the volume expansion due to the oxidation. This transforms the porous silicon into the closely-packed silicon dioxide without changing an original shape of the porous silicon region. Required conditions are as follows:

(a) Volume of 1 mol of silicon $V_{Si}$ is:

$$V_{Si} = Z_{Si}/\rho_{Si} \quad (5)$$

here, Z represents molar equivalent, and $\rho$ represents specific gravity.

(b) When this silicon is transformed into porous silicon having constant porosity P, silicon existing in the above volume is (1 P) mol.

(c) When the above silicon of (1 P) mol is oxidized and melted, the volume of the silicon dioxide becomes:

$$V_{SiO2} = (1-P)*Z_{SiO2}/\rho_{SiO2} \quad (6)$$

(d) Critical porosity Po is defined as porosity which equalizes the above volumes (5) and (6), which means making no change in the volume after oxidation, the following equations are given:

$$Po = 1-(\rho_{SiO2}/\rho_{Si})*(Z_{Si}/Z_{SiO2}) = 1 \text{ A} \quad (7)$$

$$A = (\rho_{SiO2}/\rho_{Si})*(Z_{Si}/Z_{SiO2}) \quad (8)$$

here, $\rho$ represents specific gravity, Z represents molar equivalent, and Si and $SiO_2$ denote silicon and silicon dioxide respectively. Substituting the following well-known physical property value into above equations (7) and (8), $Z_{Si} = 28.0855$ g/mol $Z_{SiO2} = 60.0843$ g/mol $\rho_{Si} = 2.3291$ g/cm3

$\rho_{SiO2} = 2.24$ g/cm3 gives critical porosity Po=55.0%.

Moreover, if the porosity is changed by P from Po, the volume change $\Delta V SiO_2$ is given by the equation below:

$$V_{SiO2} = -\Delta P * (Z_{SiO2}/Z_{Si})/(\rho_{Si}/\rho_{SiO2}) \quad (9)$$

$$= -\Delta P/A = -2.224\Delta P$$

That is, when the porosity changes by 1%, the volume change is $\Delta V_{SiO2} = 2.224\%$.

Figure 8A:
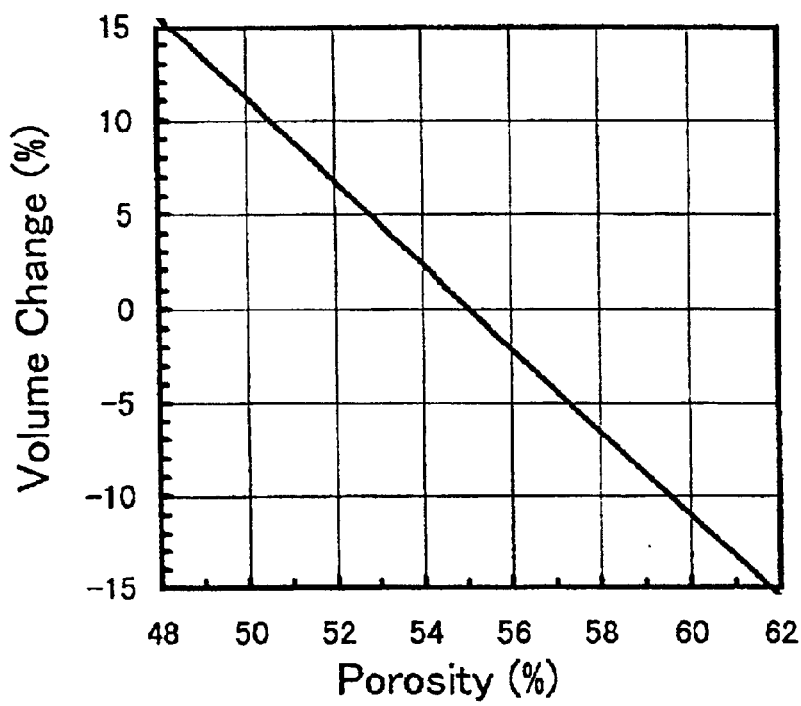
FIGS. 8A–8B are views showing a relationship between porosity of the porous silicon and volume change after oxidizing the porous silicon.
Figure 8B:
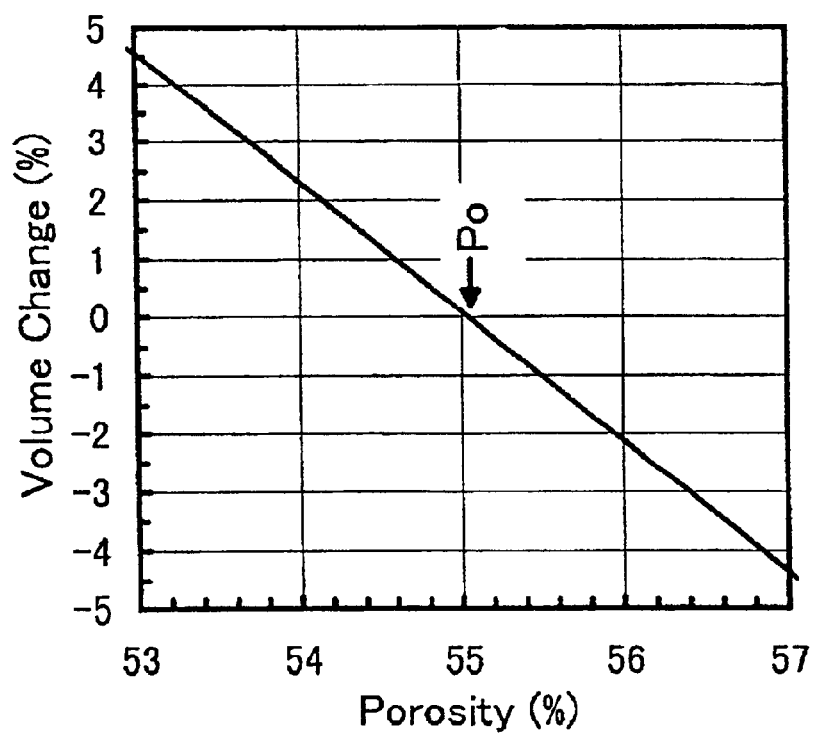

FIG. 8 shows a relationship concerning the volume change between the above-mentioned porous silicon porosity P and silicon dioxide $SiO_2$. FIG. 8A is a view showing it for a wide range of porosity from 48% to 62%. FIG. 8B is a view showing it for a narrow range of porosity from 53% to 57%. As shown in figures, when porosity is controlled to the critical porosity Po, the volume change after oxidizing the porous silicon becomes zero. Thus, the volume occupied by the porous silicon is entirely replaced by the volume of dense silicon dioxide. When the porosity is larger than Po ($\Delta P>0$), the volume shrinks. When the porosity is smaller than Po ($\Delta P<0$), the volume expands. The volume change coefficient is —$\Delta P/A$ as mentioned above. This theory holds in either of the selective forming and whole surface forming.

Figure 9A:
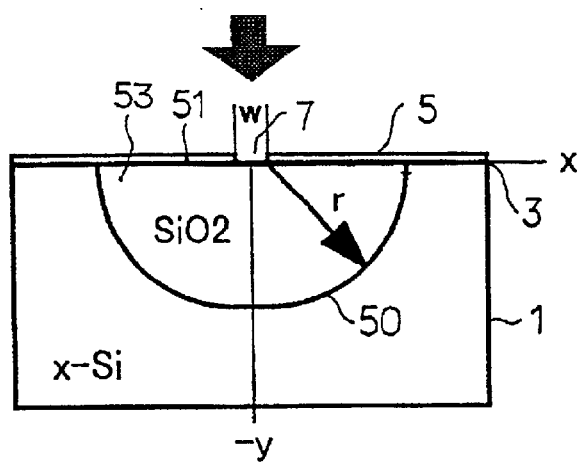
FIGS. 9A–9C are views showing shapes of the silicon dioxide surface after oxidizing the selectively-formed porous silicon.

Hereafter, a problem of volume change associated with the selective forming which concerns a main object of the present invention will be explained. Here, the study is given to a cross-sectional shape of the oxidized porous silicon which is formed in the embodiment shown in FIGS. 1A to 1C. As an example of parameters, w=6 $\mu$m, and r=27 $\mu$m are given. FIG. 9A shows coordinates in the cross-sectional shape of the porous silicon including silicon dioxide 53 which is formed by oxidizing and melting. A y-coordinate is defined in the silicon substrate 1, starting from an intersection point of the center of mask opening width "w" and the original surface of the silicon substrate 1. A x-coordinate is defined along with the substrate surface 3, starting from the center of mask opening width "w".

As to the surface shape of the silicon dioxide which is obtained by oxidizing the selectively formed porous silicon region, each of value is calculated as follows. The shape of an interface 50 between the silicon dioxide and silicon is represented by the following equations:

$$y = -\{r^2(x-w/2)^2\}^{1/2} \quad [x] \geq w/2 \quad (10)$$

$$y = -r \quad [x] \leq w/2 \quad (11)$$

In these equations, x and y represent positions on the coordinates in FIG. 9A, and r, w and [x] respectively represent a radius in the porous silicon forming, mask opening width and absolute value of x.

Next, it is assumed that, as to the volume change such as expansion and shrinkage due to oxidation, influence of the volume change is avoided by raising and lowering the surface (free surface) of the silicon dioxide. Thereby, a surface position y on an arbitrary x-coordinate is given by the equations below:

$$y = -\{r^2(x-w/2)^2\}^{1/2} * \Delta P/A \quad [x] \geq w/2 \quad (12)$$

$$y = -r * \Delta P/A \quad [x] \leq w/2 \quad (13)$$

Figure 9B:
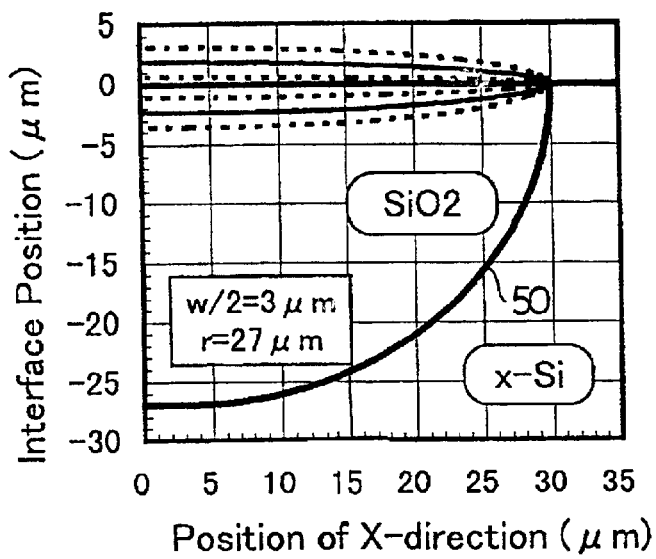
Figure 9C:
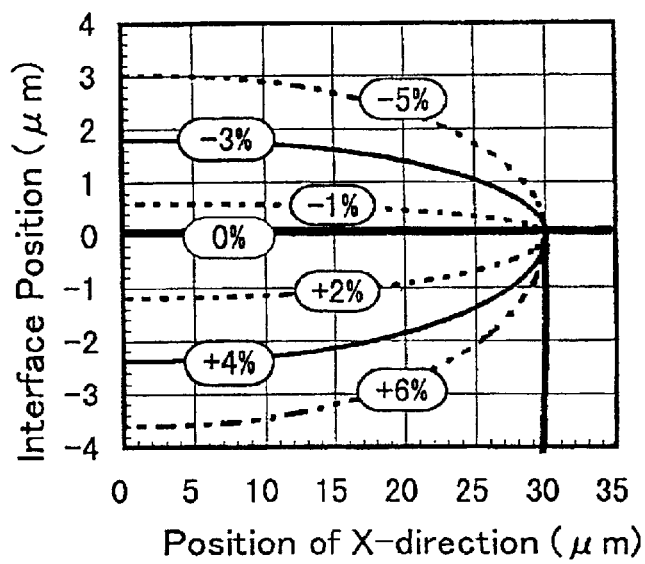

A result of the above calculation is shown in FIGS. 9B and 9C. FIG. 9B shows the shape of the interface between the silicon dioxide and silicon, and FIG. 9C shows the shape of the silicon dioxide surface 51 in detail. In FIG. 9C, numerical values on curved lines represent $\Delta P$ in percentage.

It is clear from these figures that, especially in the condition of $\Delta P=0\%$ (P=Po), the silicon dioxide surface is in the same plane with the original surface 3 of the silicon substrate. FIG. 9C shows an example of the interface shape according to the volume expansion in the condition that $\Delta P$ is negative, and shows a detailed example of the interface shape according to the volume shrinkage in the condition that $\Delta P$ is positive.

Further, y-coordinate value in the center of mask opening width "w" is shown in table 1.

TABLE 1

| ΔP (%) | y-position (μm) | ΔP (%) | y-position (μm) |
|---|---|---|---|
| 0.00 | 0.000 | 0.00 | 0.000 |
| −1.00 | 0.598 | 1.00 | −0.598 |
| −2.00 | 1.196 | 2.00 | −1.196 |
| −3.00 | 1.794 | 3.00 | −1.794 |
| −4.00 | 2.392 | 4.00 | −2.392 |
| −5.00 | 2.990 | 5.00 | −2.990 |
| −6.00 | 3.588 | 6.00 | −3.588 |

As shown in Table 1, in the case that ΔP is within a range of ±6%, the maximum displacement of the y-position is as small as about 3.6 m. In the case that ΔP is within a range of ±3%, the maximum displacement is about 1.8 μL These values are much smaller than those of the later-explained compared example are.

As described above, in the case of the oxidation of the porous silicon, it is desired that the porosity be in the range from 52% to 62%. This is because, the lower limit 52% is smaller than the above critical porosity Po by 3%, and the volume expansion in the oxidation of the porous silicon is reduced by one-half or more compared to the porous silicon formed by the conventional method described later in the compared example. Also, the upper limit 65% is the impurity doping critical porosity in the case of doping titanium dioxide of about 5 mol % into silicon dioxide.

If the porosity is controlled as mentioned above, the porous silicon can be designed so as not to expand nor shrink its volume after the oxidation relative to the volume of the porous silicon before the oxidation. Accordingly, as shown in FIG. 9A, the surface 51 of the silicon dioxide 53 can be designed to be in the same plane as the original surface 3 of the silicon substrate 1.

In the Case of Doping a Highly Concentrated Impurity

FIGS. 8 and 9 show a relationship between porosity and volume change in oxidation of the porous silicon.

Figure 10:
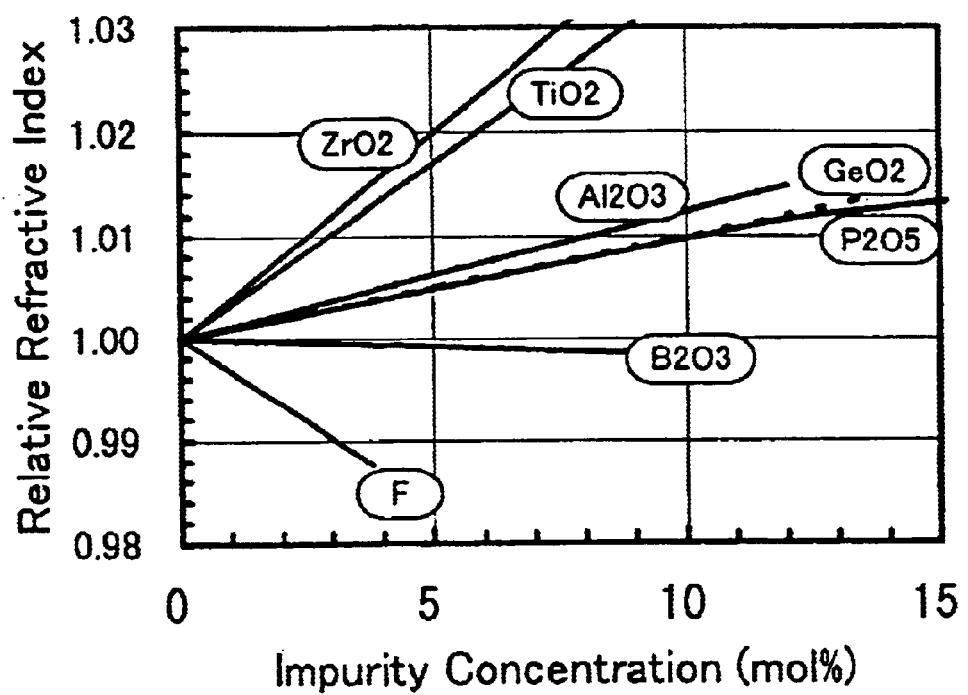
FIG. 10 is an already-known view showing a relationship between concentration of various metal oxides and fluorine (F) which are mixed into the silicon dioxide, and a refractive index of mixtures.

Hereafter, the explanation is given to an embodiment for minimizing the volume change of the porous silicon into which an impurity is doped after oxidization. In an optical waveguide shown in the later-described FIG. 14, a refractive index is increased by doping titanium into first porous silicon region 55. On the other hand, no element is doped into second porous silicon region 57 that is used as a cladding. If the silicon dioxide is used as an optical waveguide, though the refractive index difference between the core and cladding is mostly determined by conditions for designing an optical waveguide, the difference of the refractive index as large as about 2% may be employed to a waveguide having large difference of the refractive indexes. FIG. 10 shows a well-known relationship between the impurity concentration and refractive index in the case of adding various impurities into the silicon dioxide (quartz glass), which is normalized by the refractive index of the silicon dioxide. In order to give 2% of the difference of the refractive index, impurity concentration to add is required to be about 5% in $ZrO_2$, 6% in $TiO_2$, or further higher in $Al_2O_3$ and $GeO_2$.

As described above, in the case of oxidizing the porous silicon in which a highly-concentrated impurity was doped, the volume expansion associated with the oxides of the added impurity elements should be considered for forming the porous silicon.

Theory in this case is similar to the previously described case shown in FIG. 8:

(a) Volume of 1 mol of silicon $V_{Si}$ is:

$$V_{Si} = Z_{Si}/\rho_{Si} \tag{5}$$

(b) When this silicon is transformed into porous silicon having constant porosity P, silicon existing in the above volume is (1−P) mol.

(c) When the above silicon of (1−P) mol is oxidized and melted, the volume of the silicon dioxide becomes:

$$V_{SiO2} = (1-P) * Z_{SiO2}/\rho_{SiO2} \tag{6}$$

(d) Relative to (1=P) mol of silicon dioxide, the volume of x mol of the added oxidized impurity is:

$$V_{imp} = x(1-P) * Z_{imp}/\rho_{imp} \tag{14}$$

(e) In order to equalize the sun volume of (6) and (14) to the volume of (5), the equation below should be satisfied:

$$Z_{Si}/\rho_{Si} = (1-P)Z_{SiO2}/\rho_{SiO2} + \{x/(1-P) * Z_{imp}/\rho_{imp}\} \tag{15}$$

That is, if impurity doping critical porosity $P_{imp}$ is the required condition for making no change in the volume after oxidizing the impurity-doped porous silicon, the equation below is given:

$$Po_{imp} = 1 - \{A/2 + (A2/4 - x*B)\}^{1/2} \tag{16}$$

In the above equation, $$A = (Z_{Si}/Z_{SiO2}) * (\rho_{SiO2}/\rho_{Si})$$

$$B = (Z_{imp}/ZSiO2) * (\rho_{SiO2}/\rho_{imp}) \tag{8}$$

In these equations, x represents a mole ratio of the added oxidized impurity element to the silicon dioxide. If titanium dioxide ($TiO_2$) as an example of an impurity to add, and rutile-type crystal density are employed considering specific gravity, the following equations are given:

$$\rho_{imp} = \rho_{TiO2} = 4.23 \text{ g/cm}^3,$$

$$Z_{imp} = Z_{TiO2} = 79.8788 \text{ g/mol}$$

In the above equation (16), impurity doping critical porosity $P_{imp}$ is shown in FIG. 11 as a function of a mole ratio x. In the figure, the horizontal axis shows mole ratios of titanium dioxide ($TiO_2$) to silicon dioxide ($SiO_2$), and the vertical axis shows critical porosity $Po_{imp}$ in the case of doping the impurity having a corresponding concentration.

Figure 11A:
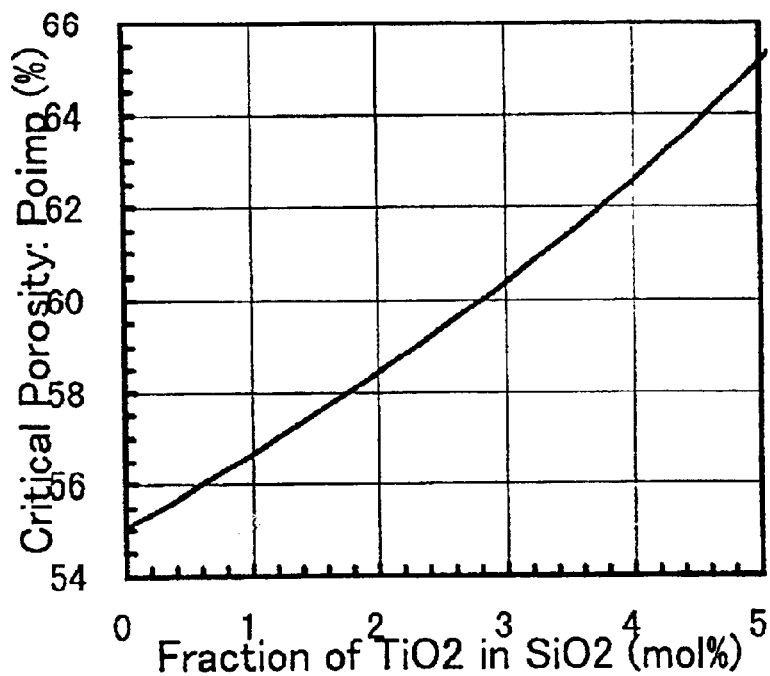
FIGS. 11A–11B are views showing a relationship between concentration of titanium dioxide mixed into the porous silicon and impurity doping critical porosity $P_{imp}$.
Figure 11B:
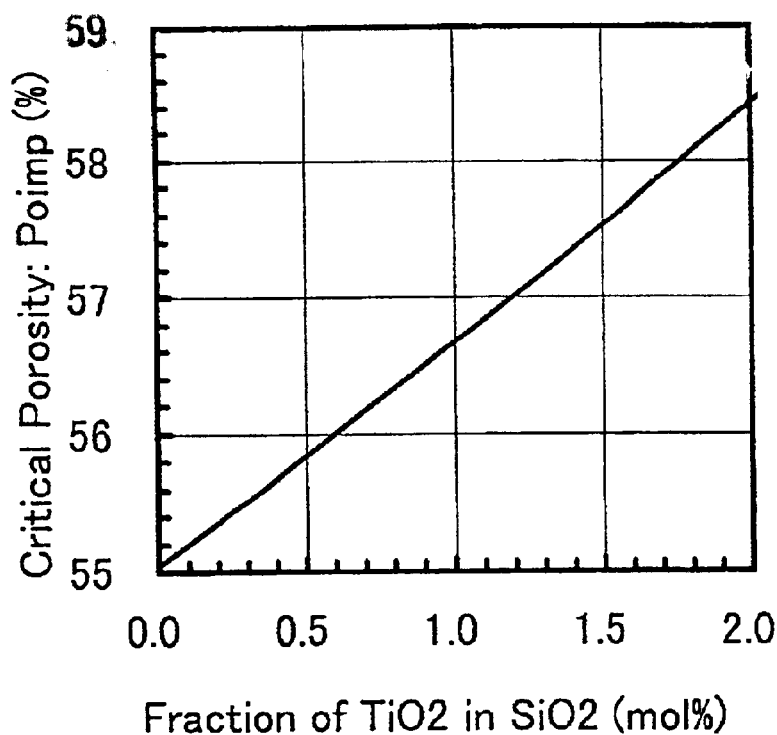

FIG. 11A shows a range from 0% to 5% as x. FIG. 11B shows a range from 0% to 2% in detail. As shown in the figure, if 2 mol of titanium dioxide ($TiO_2$) is added, the impurity doping critical porosity $Po_{imp}$ increases to 58% or more. Further, if 5 mol of titanium dioxide ($TiO_2$) is added, the impurity doping critical porosity $Po_{imp}$ increases to 65% or more.

Figure 12A:
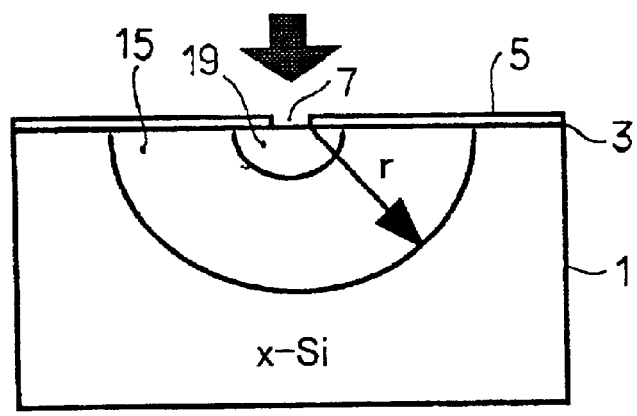
FIGS. 12A–12B schematically show a control method of the multilayer porous silicon in the case of selectively doping a highly concentrated impurity.
Figure 12B:
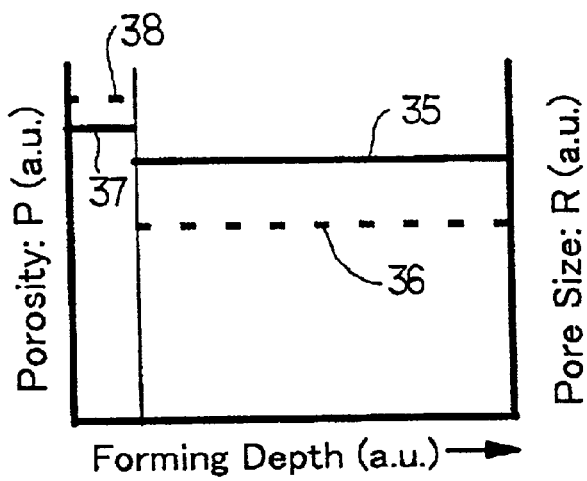

The above-mentioned value becomes considerably bigger than the critical porosity Po=55% shown in FIG. 8. When the highly-concentrated impurity is doped, an effect caused by the volume of the doped impurity to the porous silicon volume after oxidization should be previously considered. A method for forming the porous silicon in this case is shown in FIG. 12. In FIGS. 12A and 12B, it is desired that porosity 37 of first porous silicon region 19 be designed to be the impurity doping critical porosity $Po_{imp}$, and the porosity of second silicon region be the critical porosity Po.

If titanium as any desired high concentration is doped into the porous silicon which is formed considering the above-mentioned conditions, following which, the porous silicon is oxidized, the two kinds of surfaces of silicon dioxide can be maintained to be in the same plane as the original surface of the silicon substrate.

Figure 13:
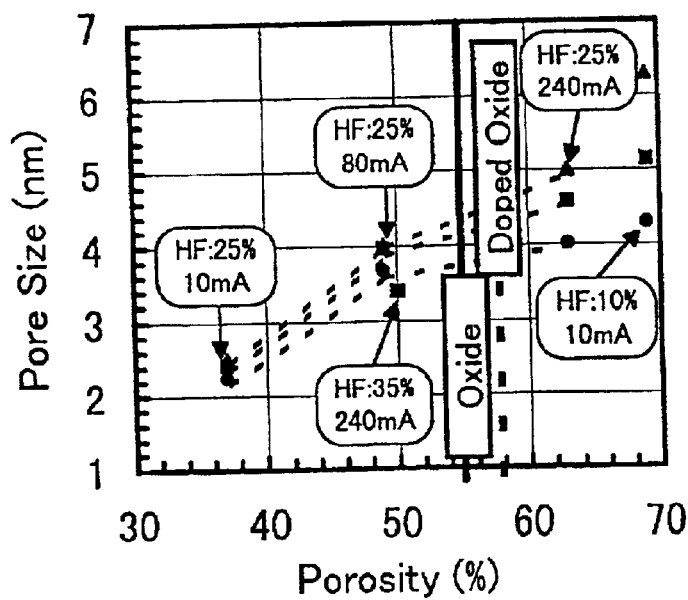
FIG. 13 is a view showing a relationship between porosity and pore size in the case of selectively doping a highly concentrated impurity.

FIG. 13 shows a fundamental thought of this embodiment of the present invention. In order to form the first porous silicon region which grows into an impurity doping silicon dioxide region, porosity should be previously designed to be large. That is, in order to form the silicon dioxide in which the impurity is doped, it is required to form the porous silicon having critical porosity $Po_{imp}$ corresponding to the doping concentration. Further, in order to form the silicon dioxide in which no impurity is doped, it is required to form the porous silicon having critical porosity Po.

Process to form Optical Waveguide

Referring to FIG. 14, a fundamental concept about a forming method for forming an optical waveguide which is an application example of the present invention. As shown in FIG. 14A, the forming method starts with a process of depositing a thin-film mask layer 5 on one surface 3 of the silicon substrate 1, and forming an opening area 7 having any desired width "w" by photo-etching. Then, the first porous silicon region 13 is formed on the substrate 1 as the anode in a first forming condition, following which, the second porous silicon region 15 is formed in a second forming condition (FIG. 14B).

Especially, when no impurity is doped into the second porous silicon region 15, it is desired that the porosity of the second porous silicon region 15 be designed to be the above-mentioned critical porosity Po to minimize the volume change after oxidation. Further, if an impurity is doped into the first porous silicon region 13, it is desired that the porosity of first porous silicon region 13 be designed to be the above-mentioned impurity doping critical porosity $Po_{imp}$ in consideration of an effect of the doped impurity to the volume after oxidation. Furthermore, regarding the pore size R, it is desired that pore size R13 of the first porous silicon region 13 be designed to be larger than pore size R15 of the second porous silicon region 15. Besides, in connection with molecular size $R_{imp}$ of an impurity which will be doped in a next procedure, designing a relationship of R13>$R_{imp}$>R15 enables the selective doping of the impurity in the next procedure.

Figure 14A:
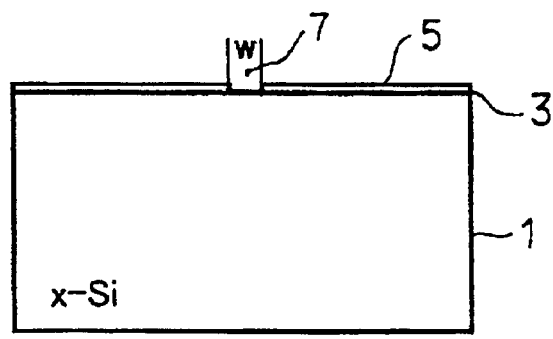
FIGS. 14A–14E are cross sectional views showing a basic manufacturing method of an optical waveguide.
Figure 14B:
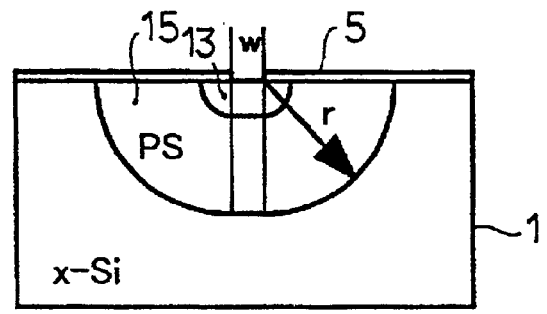
Figure 14C:
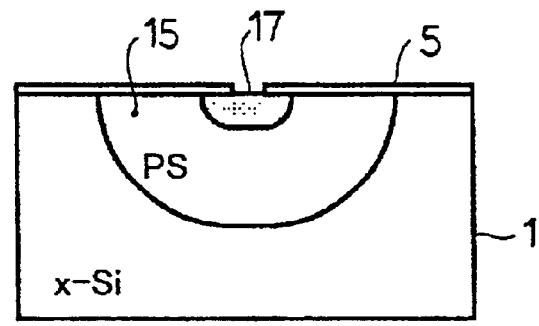

The substrate on which multilayer porous silicon is formed, is immersed into a titanium organic compound solution, after that, the compound solution depositing on the substrate surface is removed. This process dopes impurity molecules into pores of first porous silicon region 13, and the first porous silicon region 13 grows into a region 17 in which the impurity is doped (FIG. 14C). Since the pore size of the second porous silicon region 15 is smaller than molecular size of the impurity, the impurity cannot be entered into the pores of the second silicon region 15.

Then, the substrate 1 is oxidized for about an hour at for example 1150° C. in wet oxygen atmosphere. After that, the mask layer 5 is removed by etching (FIG. 14). This oxidation process transforms the first porous silicon region 13 in which titanium was doped, into a core region 55 having an increased refractive index. Also, since a second porous silicon region 15 is silicon dioxide ($SiO_2$) into which no impurity was doped, this process transforms it into a cladding 57 having a lower refactive index. Thus, this completes an optical waveguide. Then, it is possible to form an upper cladding layer 59 when required (FIG. 9E).

Figure 14D:
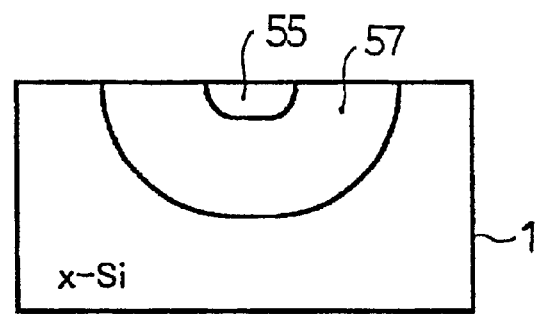
Figure 14E:
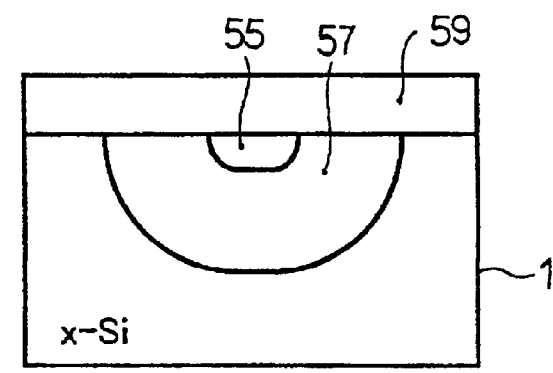

In an optical waveguide structure shown in FIG. 14D is formed in a condition of w=0.75 to 6 μm, and r=27 μm, laser light of wavelength 1.55 μm was introduced from one end of the optical waveguide, and near field pattern (NFP) is measured.

Figure 15A:
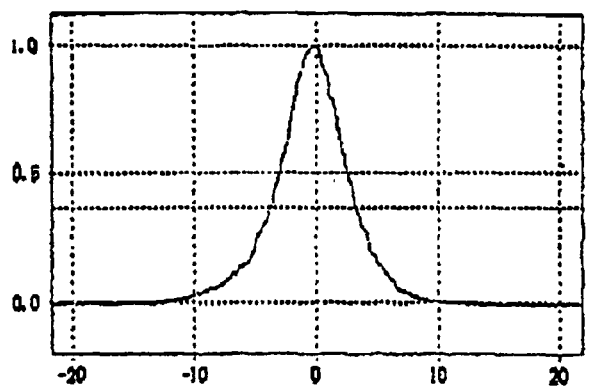
FIGS. 15A–15C are views showing an example of near field pattern (N.F.P.) of light transmitted in the optical waveguide.
Figure 15B:
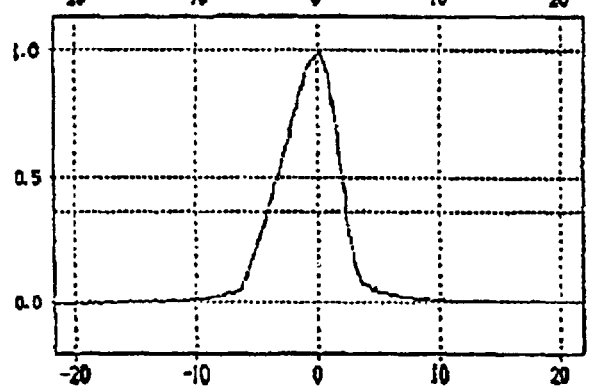
Figure 15C:
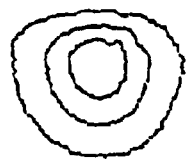

FIG. 15 shows an example of the NFP of the optical waveguide which is formed in a condition of w=6 μm. FIG. 15A shows a distribution of light intensity of horizontal direction to the substrate, and FIG. 15B shows a light intensity distribution in vertical direction. FIG. 15C shows intensity contour. The NFP is symmetric in horizontal direction to the substrate surface. On the other and, asymmetry of the NFP in vertical direction to the substrate surface is due to an abrupt change of the refractive index in the optical waveguide which has no upper cladding layer as shown in the structure of FIG. 14D. As shown in the figure, the intensity of the introduced light is transmitted by single mode, and centered at a single peak.

Figure 16:
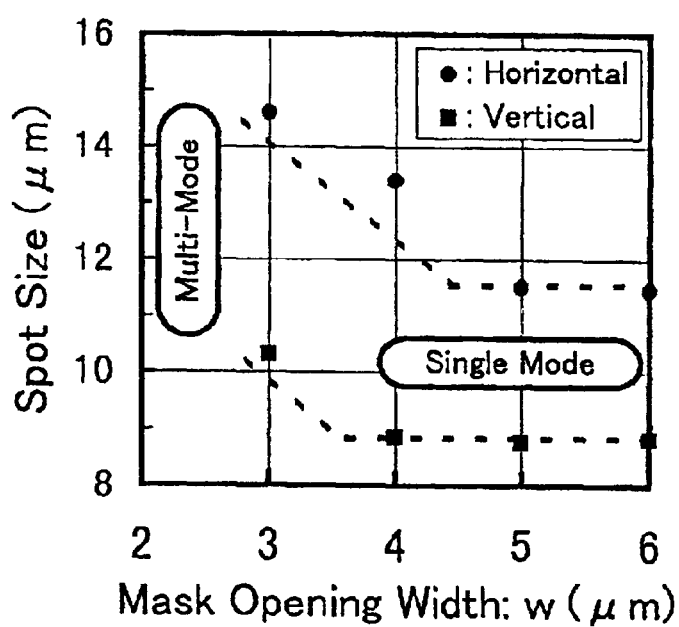
FIG. 16 is a view showing an example of mask opening width dependence of spot size of the light transmitted in the optical waveguide.

FIG. 16 shows an example of dependence of the introduced light spot size on mask opening width "w". As shown in the figure, when the mask opening width "w" is between 4 and 6 μm, the introduced light is transmitted by single mode. When the mask opening width "w" is less than 4 μm, the width of NFP increases as the mask opening width "w" decreases. If the mask opening width "w" is 3 μm or less, the NFP shows plural peaks, which indicates that the transmitted light is multimode. In this embodiment, when the mask opening width "w" becomes small, the transmitted light becomes multimode. This is due to the decrease of the effect for increasing the refractive index in the core region since the quantity of doped titanium decreases as the opening width "w" decreases.

Compared Example

Figure 17A:
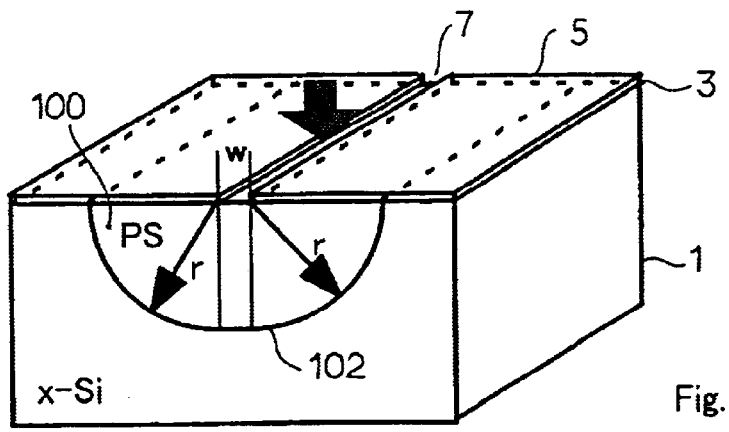
FIGS. 17A–17D are views showing a compared example.
Figure 17B:
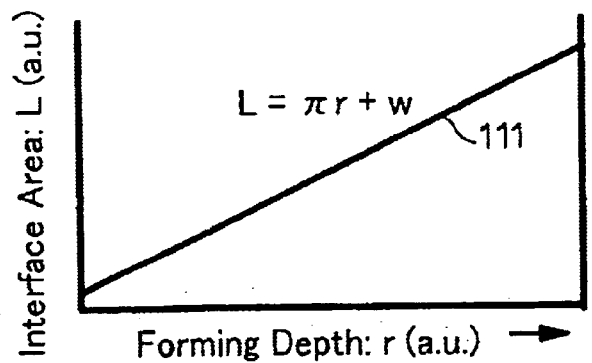

As is the case with FIG. 1A, mask layer 5 of a thin silicon nitride film is deposited on one surface 3 of the silicon substrate 1 having a specific resistance of 0.01 Ωm in which highly-concentrated B is doped, and the mask opening area 7 with the width w is formed on the mask layer (FIG. 17A). After, that a porous silicon region is formed at constant forming current. As shown in FIG. 17B, an area of the interface 102 between porous silicon 100 and silicon increases per unit length as follows:

$$L = \pi r + w$$

Figure 17C:
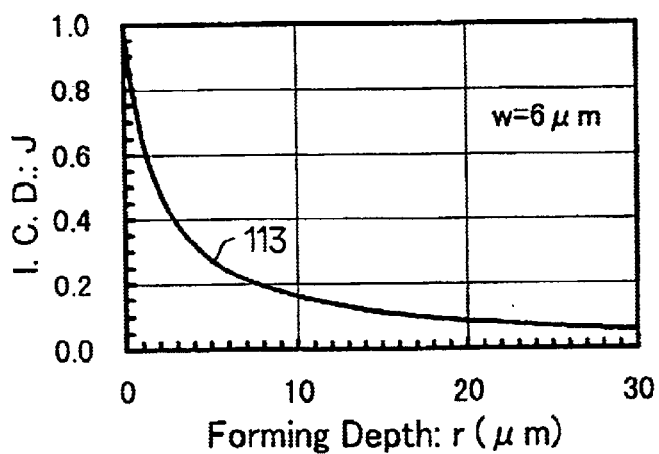
Figure 17D:
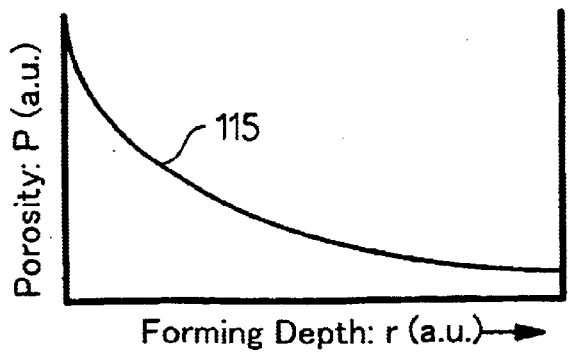

Since the forming current is constant, as shown in FIG. 17C, interface current density in the interface between the porous silicon and silicon decreases as the porous silicon grows. The figure shows an example in the case of w=6 μmm, normalizing an initial interface current density as 1. Thus, since the interface current density decreases with the forming depth, porosity 115 of the porous silicon region 100 decreases with the forming depth as shown in FIG. 17C. In the initial stage of the forming, interface current density of an interface 102 between the porous silicon 100 and silicon 1 is considerably high, but the current density greatly decreases as the porous silicon grows. Then, in the closing stage of the forming, the interface current density becomes extremely lower than the initial value. In an example shown in the figure, when the forming depth "r" is 30 μm, the interface current density decreases to 6% relative to the initial value. As a result, as shown in FIG. 17D, while the porosity is high at the initial stage of the forming, the porosity is low at the closing stage.

Figure 18:
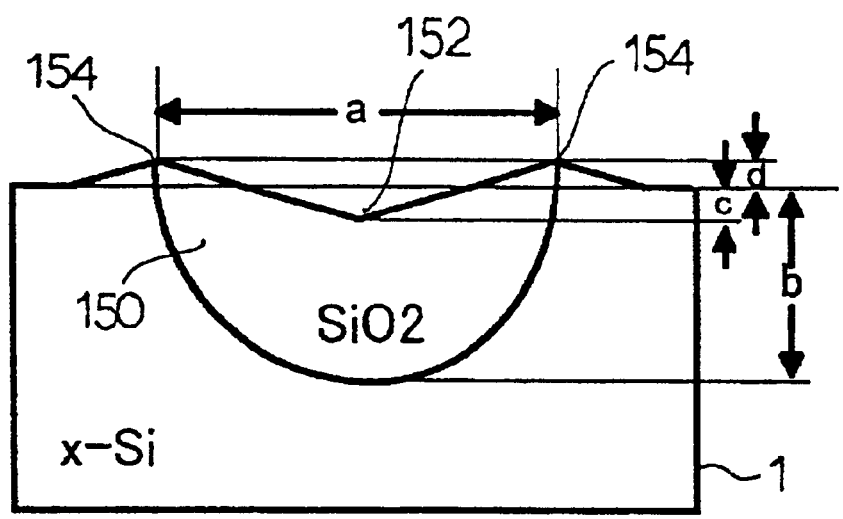
FIG. 18 is a cross sectional view showing dimensions for a detailed analysis of a cross-sectional shape of the oxidized porous silicon in the compared example.
Figure 19A:
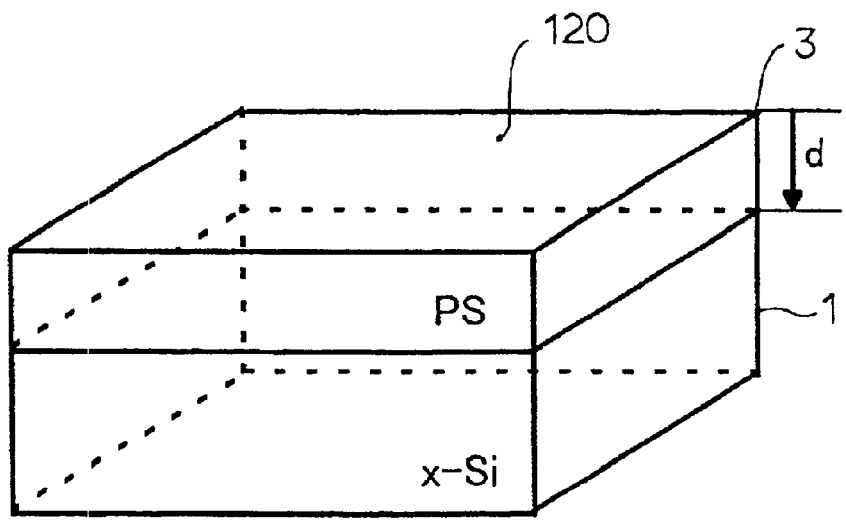
FIGS. 19A–19C are views concerning growth of the porous silicon in conventional whole surface forming.
Figure 19B:
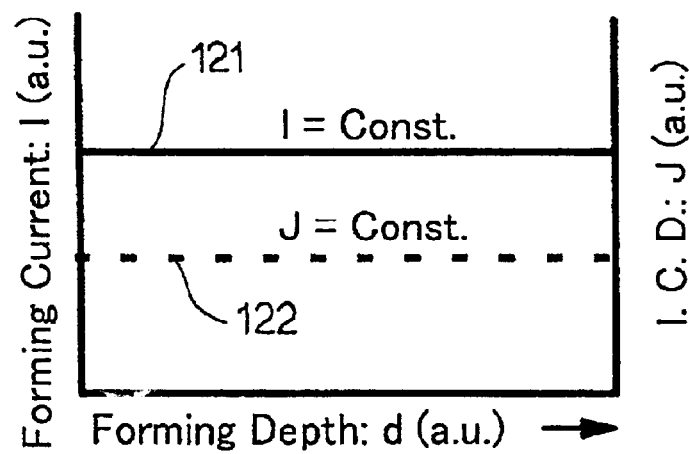
Figure 19C:
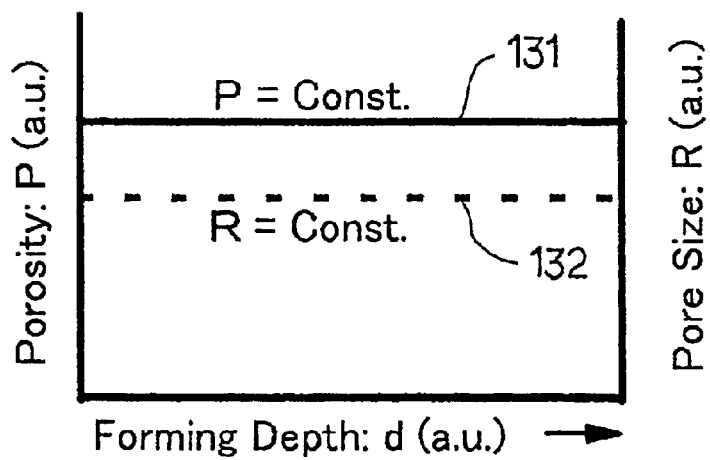

The porous silicon is oxidized and melted for an about 1 hour at 1150° C. in wet oxygen atmosphere. A typical example of the cross section of such silicon dioxide is shown in FIG. 18. Volume shrinkage is observed at a center part 152 of the silicon dioxide region 150, and volume expansion of oxide is obviously observed at parts 154 adjacent to the interface with the silicon. This result shows that, while the oxide around the interface is influenced by compressive stress, the silicon adjacent to the interface is partially influenced by tensile stress. If a test sample formed in the above-mentioned manner is placed at a room temperature for about one month, a microscopic observation shows a cross section in which chips are frequently generated in an interface part 154 between volume-expanded

TABLE 2

| w (μm) | Length: μm | | | | Ratio of Length | | | | |
|---|---|---|---|---|---|---|---|---|---|
| | a | b | c | d | a/b | (a−w)/b | c/b: % | d/b: % | (c+d)/b % |
| 0.75 | 52.74 | 25.14 | 3.63 | 3.42 | 2.10 | 2.068 | 14.44 | 13.62 | 28.07 |
| 0.75 | 52.40 | 24.66 | 3.56 | 3.01 | 2.13 | 2.095 | 14.44 | 12.22 | 26.67 |
| 6.00 | 61.44 | 26.91 | 3.74 | 3.74 | 2.28 | 2.060 | 13.90 | 13.90 | 27.81 |
| 6.00 | 59.29 | 26.64 | 3.93 | 3.21 | 2.23 | 2.000 | 14.75 | 12.06 | 26.81 |
| 6.00 | 59.52 | 28.81 | 3.95 | 3.33 | 2.22 | 1.996 | 14.74 | 12.43 | 27.18 |
| 6.00 | 59.95 | 26.35 | 4.03 | 3.55 | 2.28 | 2.047 | 15.29 | 13.49 | 28.78 |
| average | 57.56 | 26.08 | 3.81 | 3.38 | 2.20 | 2.045 | 14.59 | 12.96 | 27.55 | silicon dioxide and silicon by microstructure chipping. That is, the interface between the porous silicon and silicon partially contains high stress. On the other hand, length a, b, c and d defined by arrows in FIG. 18 is shown in table 2 as a result measured in a scanning electron microscopy picture for plural test samples.

Table 2 shows examples when the mask opening width "w" is 6.0 μm and 0.75 μm. Value of horizontal width "a" distributes in a considerable wide range (about 52–61 μm). On the other hand, value a/b slightly exceeds 2. In further detail value (a−w)/b approximates 2.0. Even if experimental errors are considered, this result indicates that the forming of the porous silicon is isotopic as explained above.

On the other hand, value (c+d) which is sum value of volume expansion and shrinkage is about 7 μm. The average value of (c+d)/d is as large as about 27%, which indicates that volume expansion and shrinkage coexist with each other, and each of them is considerably large.

Compared with the above-described value, the embodiment shown in FIG. 9 shows the expansion or shrinkage value 3.6 m in ΔP=±6%, and the forming depth 13% which is ½ of that of the present embodiment. This shows importance and effectiveness of the porosity control and volume change control after oxidation by the method in accordance with the present invention.

The present invention is not limited to the above-described embodiment, but includes varied or modified embodiments from the above.

As described above a silicon substrate in a condition that depth of a silicon dioxide region which is selectively formed on one surface, is "b", and a difference between said one surface of the silicon substrate and the surface of the silicon dioxide region is "c+d", the value (c+d)/b is designed to be within a range of ±6%, is extremely advantageous to mounting of optical elements such as optical fiber and the like as an optical module substrate, compared with a conventional optical module which is formed by thick-film depositing and etching. In this silicon substrate, it is possible to relieve large amount of partial stress contained in an interface between the silicon dioxide and silicon, thereby allowing to manufacture a device having stable reliability, in which the silicon dioxide and the silicon are in contact with each other, especially an optical waveguide.

In a silicon substrate, porous silicon which is selectively formed on one surface of the silicon substrate, has porosity designed to be from 52 to 62%; therefore, if an optical waveguide is formed by utilizing said porous silicon, an upper surface of a core and a cladding around said core is designed to be in the same plane as an original surface of the silicon substrate. The silicon substrate in which the core surface of the optical waveguide is in the same plane as the original surface of the silicon substrate, is extremely advantageous, as an optical module substrate, to mounting of optical elements such as optical fiber and the like compared with a conventional optical module which is formed by thick-film depositing and etching.

In a method for forming a silicon substrate, forming current is increased in accordance with growing degree of porous silicon so as to maintain interface current density between a growing end part of the porous silicon and the silicon substrate to be constant in a process of anodic forming, thereby making it possible to form the porous silicon having porosity and pore size which are selectively controlled in silicon crystal. Also, this method enables to form multilayer porous silicon having same porosity and different sizes, and to selectively dope an impurity into one of said plural porous silicon layers. Besides, porous silicon having plural layers each of which has previously designed porosity and pore size can be formed. This method further makes it possible to form porous silicon in which pore size and porosity is designed according to the impurity to dope and impurity concentration, and to selectively dope the impurity into one of said porous silicon, and allows to develop a method of introducing critical porosity for minimizing volume change of the porous silicon after oxidation. Due to the above-mentioned method, an optical waveguide is formed such that an upper surface of a core and a cladding around the core can be in the same plane as the original surface of the silicon substrate. The silicon substrate in which the core surface of the optical waveguide is in the same plane as the original surface of the silicon substrate is advantageous to mounting of optical elements such as optical fiber and the like compared with a conventional optical module which is formed by thick-film depositing and etching. Moreover, using the method of the present invention further makes it possible to relieve large amount of partial stress contained in an interface between the silicon dioxide and silicon, thereby allowing to manufacture a device having stable reliability, in which the silicon dioxide and the silicon are in contact with each other, especially an optical waveguide.

Further, in a method for forming a silicon substrate, a porous silicon region is formed in the silicon substrate by an anodizing process, following which, oxide film is formed on a surface of the porous silicon region, so that this method enables to form the porous silicon region in which pore size further decreases than the pore size immediately after the anodic oxidation. Also, the porous silicon having increased porosity and increased pore size can be formed by etching the oxide film formed on the surface of the porous silicon region. The process of the partial oxidation and removal of the oxide film can provide the second method for forming the second porous silicon having any desired porosity, pore size and pore size distribution.

What is claimed is:

1. A silicon subsume having a silicon dioxide body selectively formed in said silicon substrate, wherein said silicon dioxide body includes a first silicon dioxide body which has a predetermined refractive index, and a second silicon dioxide body which lies inside the silicon substrate so as to enclose said first silicon dioxide body, and said second silicon dioxide body has a lower refractive index than that of the first silicon dioxide body.

2. The silicon substrate in which the silicon dioxide body is selectively formed in said silicon substrate according to claim 1, wherein said first silicon dioxide body contains elements for increasing a reactive index of silicon dioxide, and a concentration of said elements is higher in said first silicon dioxide body than in the second silicon dioxide body.

3. The silicon substrate according to claim 2, wherein the element for increasing the refractive index of the silicon dioxide is at least one element selected from a group consisting of zirconium (Zr), titanium (Ti), aluminum (Al), germanium (Ge) and phosphorus (P).

4. A silicon substrate having a silicon dioxide body formed in said silicon substrate, wherein:

said silicon dioxide body includes a first silicon dioxide body which has a predetermined refractive index, and a second silicon dioxide body which lies inside the silicon substrate so as to enclose said first silicon dioxide body, and said second silicon dioxide body has a lower refractive index than that of the first silicon dioxide body, and said silicon dioxide body contains transition metal elements in the first silicon dioxide body providing a predetermined refractive index.

* * * * *